US009881955B2

United States Patent
Yang et al.

(10) Patent No.: US 9,881,955 B2
(45) Date of Patent: Jan. 30, 2018

(54) QUANTUM DOT IMAGE SENSOR

(71) Applicant: OMNIVISION TECHNOLOGIES, INC., Santa Clara, CA (US)

(72) Inventors: Dajiang Yang, San Jose, CA (US); Gang Chen, San Jose, CA (US); Duli Mao, Sunnyvale, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 2 days.

(21) Appl. No.: 14/882,832

(22) Filed: Oct. 14, 2015

(65) Prior Publication Data

US 2017/0110608 A1   Apr. 20, 2017

(51) Int. Cl.
*H04N 5/335* (2011.01)
*H01L 27/146* (2006.01)

(52) U.S. Cl.
CPC .... *H01L 27/14621* (2013.01); *H01L 27/1461* (2013.01); *H01L 27/1463* (2013.01); *H01L 27/14627* (2013.01)

(58) Field of Classification Search
CPC ....... H01L 2924/0002; H01L 27/14627; H01L 27/14621; H01L 27/1463; H01L 27/14687; H01L 23/53238; H01L 27/14612; H01L 23/53223; H01L 23/53266; H01L 31/18; H01L 21/76885; H01L 23/5329; H01L 21/7681
USPC ....... 348/273, 308; 438/64–69; 257/E31.037
See application file for complete search history.

(56) References Cited

U.S. PATENT DOCUMENTS

| 8,547,459 B2* | 10/2013 | Kumagai | H01L 27/14627 257/E31.097 |
|---|---|---|---|
| 8,552,415 B2 | 10/2013 | Toda | |
| 2010/0187404 A1* | 7/2010 | Klem | H01L 27/14603 250/208.1 |
| 2014/0230992 A1 | 8/2014 | Kim et al. | |
| 2015/0064832 A1* | 3/2015 | Wan | H01L 27/14634 438/65 |
| 2015/0070577 A1* | 3/2015 | Ikemoto | H04N 5/2253 348/374 |

OTHER PUBLICATIONS

Yu, Xuechao et al., "SnSe$_2$Quantum Dot Sensitized Solar Cells Prepared Employing Molecular Metal Chalcogenide as Precursors", Supplementary Material (ESI) for Chemical Communications, The Royal Society of Chemistry 2012, 5 pages.

(Continued)

*Primary Examiner* — Trung Diep
(74) *Attorney, Agent, or Firm* — Christensen O'Connor Johnson Kindness PLLC

(57) ABSTRACT

A photodetector includes a first doped region disposed in a semiconductor material and a second doped region disposed in the semiconductor material. The second doped region is electrically coupled to the first doped region, and the second doped region is of an opposite majority charge carrier type as the first doped region. The photodetector also includes a quantum dot layer disposed in a trench in the semiconductor material, and the quantum dot layer is electrically coupled to the second doped region. A transfer gate is disposed to permit charge transfer from the second doped region to a floating diffusion.

21 Claims, 5 Drawing Sheets

(56) References Cited

OTHER PUBLICATIONS

Chen, Jian et al., "Quantum-Dot Displays: Giving LCDs a Competitive Edge Through Color", Information Display, Jan./Feb. 2013, vol. 29, No. 1, pp. 12-17.

Baskoutas, S. et al., "Size-dependent band gap of colloidal quantum dots", Article in Journal of Applied Physics, 99, 013708, Feb. 2006, © 2006 American Institute of Physics, 5 pages.

Kovalenko, M. V. et al., "Colloidal Nanocrystals with Molecular Metal Chalcogenide Surface Ligands", Science, vol. 324, Jun. 12, 2009, © 2009 American Association for the Advancement of Science, downloaded from www.sciencemag.org on Jun. 5, 2009, 5 pages.

Kovalenko, M. V. et al., "Semiconductor Nanocrystals Functionalized with Antimony Telluride Zintl Ions for Nanostructured Thermoelectrics", Journal of the American Chemical Society, vol. 132, No. 19, 2010, Published on Web 27 Apr. 2010, © 2010 American Chemical Society, 10 pages.

Mocatta, D. et al., "Heavily Doped Semiconductor Nanocrystal Quantum Dots", Article in Science, vol. 332, Apr. 1, 2011, © 2011 American Association for the Advancement of Science, downloaded from www.sciencemag.org on Apr. 1, 2017, 7 pages.

Wise Research Group: Semiconductor Nanocrystals, "Lead-salt Semiconductor Quantum Dots", 2012, Cornell University, © 2012 Cornell University, 4 pages, Retrieved from: http://web.archive.org/web/20160129161831/http://wise.research.engineering.cornell.edu/qd.html.

Bhandari, K. P. et al., "Thin film solar cells based on the heterojunction of colloidal PbS quantum dots with CdS", Solar Energy Materials & Solar Cells, vol. 117, 2013, © 2013 Elsevier B.V., 7 pages.

Yang, D. et al., "Thermoelectric performance of PbSe quantum dot films", The Royal Society of Chemistry, Jun. 18, 2013, 7 pages.

InVisage, "QuantumFilm", © 2016 InVisage, 4 pages, Retrieved Dec. 6, 2016 from: http://www.invisage.com/quantumfilm/.

Taiwanese Office Action and English Translation, dated May 25, 2017, for Taiwanese Application No. 105117760, filed Jun. 4, 2016, 14 pages.

* cited by examiner

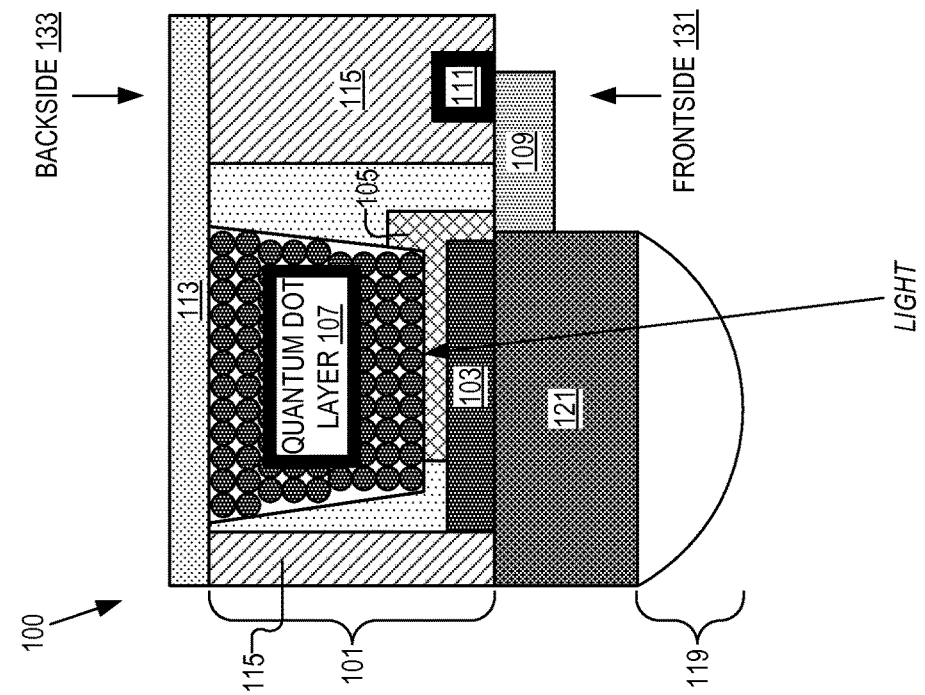
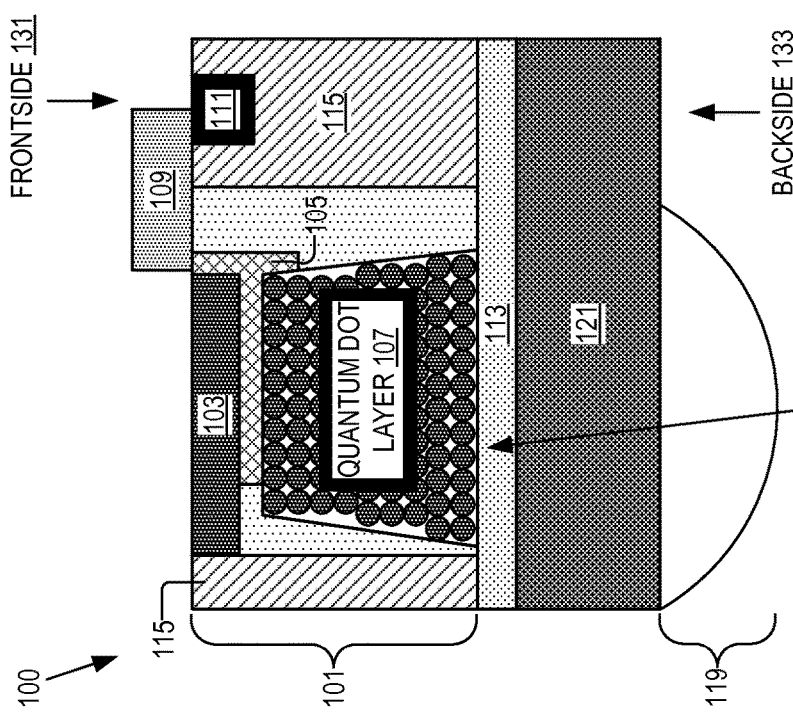

FORM P-N JUCTION AND ANCILLARY CIRCUITRY

ETCH TRENCH

DEPOSIT QUANTUM DOTS AND
REMOVE EXCESS FROM SURFACE

DEPOSIT CAPPING LAYER

FORM MICROLENS AND/OR COLOR FILTER

US 9,881,955 B2

QUANTUM DOT IMAGE SENSOR

TECHNICAL FIELD

This disclosure relates generally to image sensors, and in particular but not exclusively, relates to quantum dot image sensors.

BACKGROUND INFORMATION

A quantum dot is a semiconductor nanocrystal that is small enough to exhibit quantum mechanical effects. Specifically, a quantum dot's excitons are confined in all three spatial dimensions. The electronic characteristics of a quantum dot are closely related to its size and shape. The band gap in a quantum dot—which, as in all semiconductors, determines the frequency range of light absorbed/emitted— is inversely proportional to its size. Consequently, the color of emitted light shifts from blue to red when the size of the quantum dot is increased. In other words, the larger the quantum dot, the lower the frequency of light emitted. This size-dependent band structure allows the excitation and emission profiles of quantum dots to be highly controllable. Since the size of a quantum dot is determined when it is made, the conductive properties may be precisely tuned. Furthermore, quantum dots can be readily synthesized through organic methods/precursors facilitating low-cost batch preparation.

Quantum dots are particularly significant for optical applications due to their high extinction coefficient and tunable bandgap. Being zero-dimensional, quantum dots have a sharper density of states than higher-dimensional structures. As a result, they have superior transport and optical properties, and are being researched for use in diode lasers, amplifiers, and biological sensors. Additionally, some quantum dots can convert a single photon into multiple hole-electron pairs, making them an attractive alternative semiconductor candidate in solar cell applications.

BRIEF DESCRIPTION OF THE DRAWINGS

Non-limiting and non-exhaustive examples of the invention are described with reference to the following figures, wherein like reference numerals refer to like parts throughout the various views unless otherwise specified.

FIG. 1A is a cross sectional view of one example of a backside illuminated quantum dot image sensor, in accordance with the teachings of the present invention.

FIG. 1B is a cross sectional view of one example of a frontside illuminated quantum dot image sensor, in accordance with the teachings of the present invention.

Figure 1C:
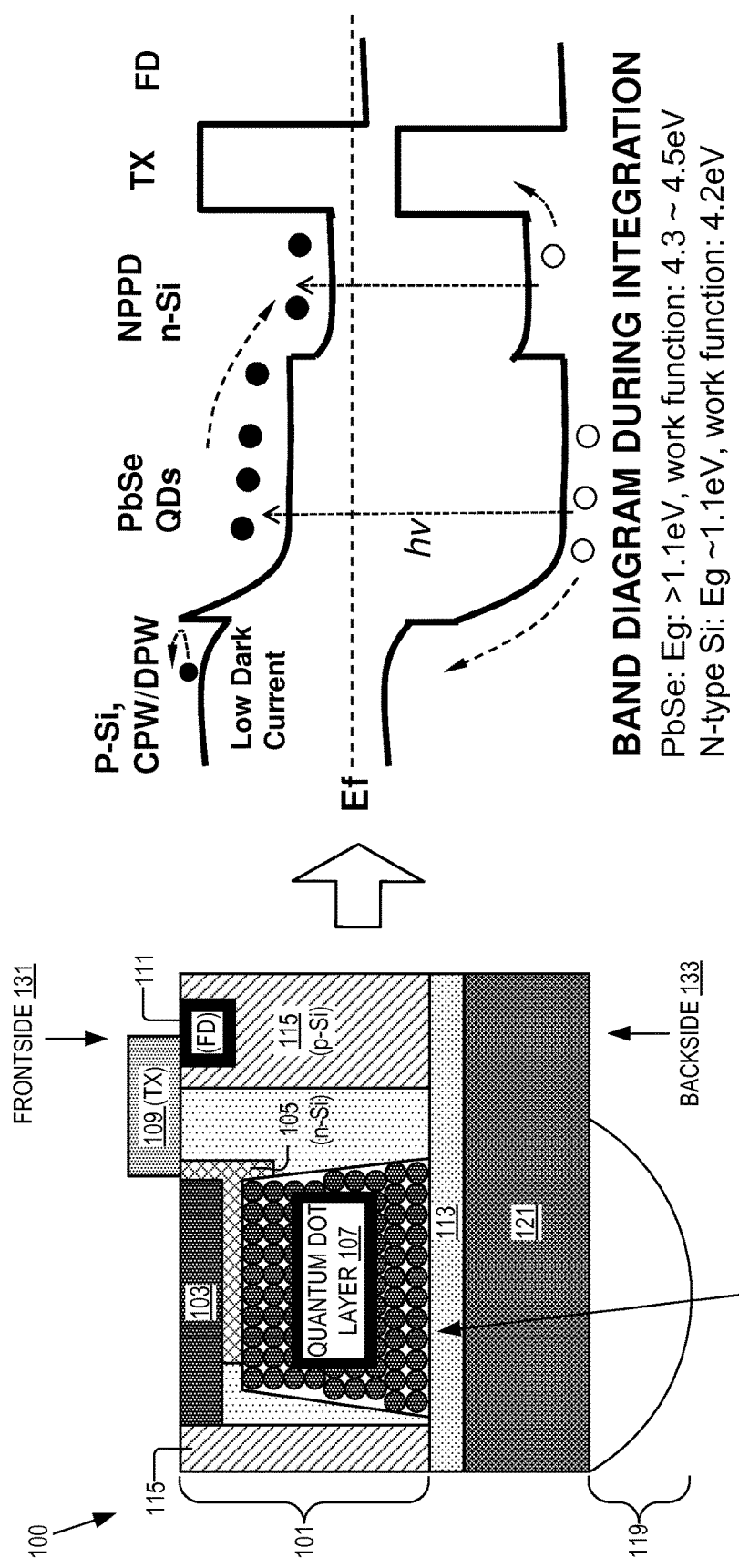
FIG. 1C is a cross sectional view of the example backside illuminated quantum dot image sensor of FIG. 1A in operation, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for a quantum dot image sensor are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols are used interchangeably through this document (e.g. Si vs. silicon); however, both have identical meaning.

FIG. 1A is a cross sectional view of one example of a backside illuminated quantum dot image sensor 100. In the depicted example, backside illuminated quantum dot image sensor 100 includes first doped region 103, second doped region 105, quantum dot layer 107, transfer gate 109, and floating diffusion 111. Second doped region 105 is electrically coupled to the first doped region 103, and second doped region 105 is of the opposite majority charge carrier type as first doped region 103. Both first doped region 103 and second doped region 105 are disposed in semiconductor material 101. Quantum dot layer 107 is disposed in a trench in semiconductor material 101, and quantum dot layer 107 is electrically coupled to the second doped region 105. In the depicted example, second doped region 105 is disposed between first doped region 103 and quantum dot layer 107. However, in another example not depicted, quantum dot layer 107 may be electrically coupled to both first doped region 103 and second doped region 105.

In one example, capping layer 113 is disposed over quantum dot layer 107 and capping layer 113 encapsulates the trench containing quantum dot layer 107. Capping layer 113 provides for a homogeneous surface over quantum dot layer 107 to allow for the deposition of subsequent layers of device architecture. Further, capping layer 113 may prevent unwanted contaminants and charge trapping molecules (such as atmospheric $O_2$) from entering quantum dot layer 107. In the depicted example, capping layer 113 is disposed between quantum dot layer 107 and microlens layer 119. Additionally, a color filter layer 121 is disposed between microlens layer 119 and capping layer 113. In the depicted example, microlens layer 119 directs light into quantum dot layer 107, and color filter layer 121 selectively passes light of a desired wavelength to quantum dot layer 107.

In the depicted example, it is worth noting that electrical isolation structures 115 surround (at least in part) components of backside illuminated quantum dot image sensor 100 including first doped region 103, second doped region 105, and quantum dot layer 107. Electrical isolation structures 115 may prevent image charge from leaking between the various electroactive components in quantum dot image sensor 100. In one example, electrical isolation structures 115 include heavily doped semiconductor wells. However, in another example, electrical isolation structures 115 may include a metal, metal oxide, semiconductor or the like. Additionally, any one of these materials or other materials may be disposed in a trench etched in semiconductor material 101 to isolate the electrical components of quantum dot image sensor 100.

FIG. 1B is a cross sectional view of one example of a frontside illuminated quantum dot image sensor 100. In the depicted example, frontside illuminated quantum dot image sensor 100 contains all of the elements of backside illuminated quantum dot image sensor 100 from FIG. 1A. However, in frontside illuminated quantum dot image sensor 100 light is absorbed in quantum dot layer 107 through a frontside 131 of the photodetector. Additionally, active circuit elements such as transfer gate 109 and floating diffusion 111 are disposed on the frontside 131 of semiconductor material 101.

FIG. 1C is a cross sectional view of the example backside illuminated quantum dot image sensor 100 of FIG. 1A in operation. The right hand portion of FIG. 1C illustrates the image sensor band structure when quantum dot image sensor 100 receives light. In the depicted example, first doped region 103 and second doped region 105 form a p-n junction disposed in semiconductor material 101. Quantum dot layer 107 is disposed in a trench in semiconductor material 101, and quantum dot layer 107 is electrically coupled to the p-n junction to form a photodiode. A plurality of these photodiodes is disposed in semiconductor material 101 and is electrically isolated from one another. In one example, electrical isolation structures 115 are disposed to reduce current flow between individual photodiodes in the plurality of photodiodes.

In the depicted example, quantum dot layer 107 is disposed to receive light through the backside 133 of the quantum dot image sensor 100, and image charge is accumulated in the plurality of photodiodes. Light is directed into the plurality of photodiodes via microlens layer 119. Light entering the photodiodes causes the formation of hole-electron pairs in quantum dot layer 107. Image charge accumulation is achieved by separating hole-electron pairs in quantum dot layer 107 using the p-n junction (e.g. first doped region 103 and second doped region 105). The image charge is transferred from the plurality of photodiodes to a plurality of floating diffusions 111. Transfer gate 109 is positioned to transfer the image charge from the plurality of photodiodes to the plurality of floating diffusions 111. By applying a voltage to transfer gate 109 the potential barrier between the plurality of photodiodes and the plurality of floating diffusions 111 is reduced, allowing image charge to flow to the plurality of floating diffusions 111.

In one example, the quantum dots in some circumstances may exhibit multiple exciton generation. In other words, an individual photon absorbed by a quantum dot may generate more than one hole-electron pair. This increase in photoinduced charge accumulation may greatly improve low-light sensitivity and enhance the quantum efficiency of the image sensor.

Another potential advantage of using quantum dots as a photon absorption layer is using synthetic methods to precisely control the wavelength of light absorbed. Since the density of states in quantum dots is directly related to the size of the quantum dot, the bandgap is proportional to the size of the quantum dot. The larger the quantum dot the smaller the bandgap, the smaller the quantum dot the larger the bandgap. Accordingly, light sensitivity of quantum dots can be tuned based on the size of the quantum dot and the material chosen to form the quantum dot. Quantum dot layer 107 may be fabricated out of semiconductor elements, metal elements, or alloys including: Si, Ge, SiGe, LnP, LnAs, CdS, PbS, PbSe, CdTe, InP, InAs, or the like. However, in one example, the quantum dot layer 107 includes a metal chalcogenide complex. In one example, metal chalcogenide complex treated quantum dots may have an electrical conductivity that is up to eight orders of magnitude higher than conventional quantum dot systems. In some examples, organic ligands remaining on the surface of the quantum dots have been removed and replaced with a metal chalcogenide complex to increase charge transfer between individual quantum dots in quantum dot layer 107 as well as to increase charge transfer between quantum dot layer 107 and second doped region 105.

In the portion of FIG. 1C illustrating the band diagram of backside illuminated quantum dot image sensor 100, the relative energy levels of the various pieces of device architecture are shown. It is important to note that the diagram is a cartoon illustration that merely approximates the actual system. In the depicted example, quantum dot layer 107 (e.g. PbSe QDs) has a higher energy conduction band than second doped region 105 (e.g. NPPD n-Si), this allows free electrons generated (via incident light hv) in quantum dot layer 107 to flow into second doped region 105. Second doped region 105 and first doped region 103 form a pinned photodiode. Thus, second doped region 105 may store free electrons until a voltage is applied to transfer gate 109 (e.g. TX), lowering the potential barrier between second doped region 105 and floating diffusion 111 and allowing the electrons to flow from second doped region 105 to floating diffusion 111.

Figure 2:
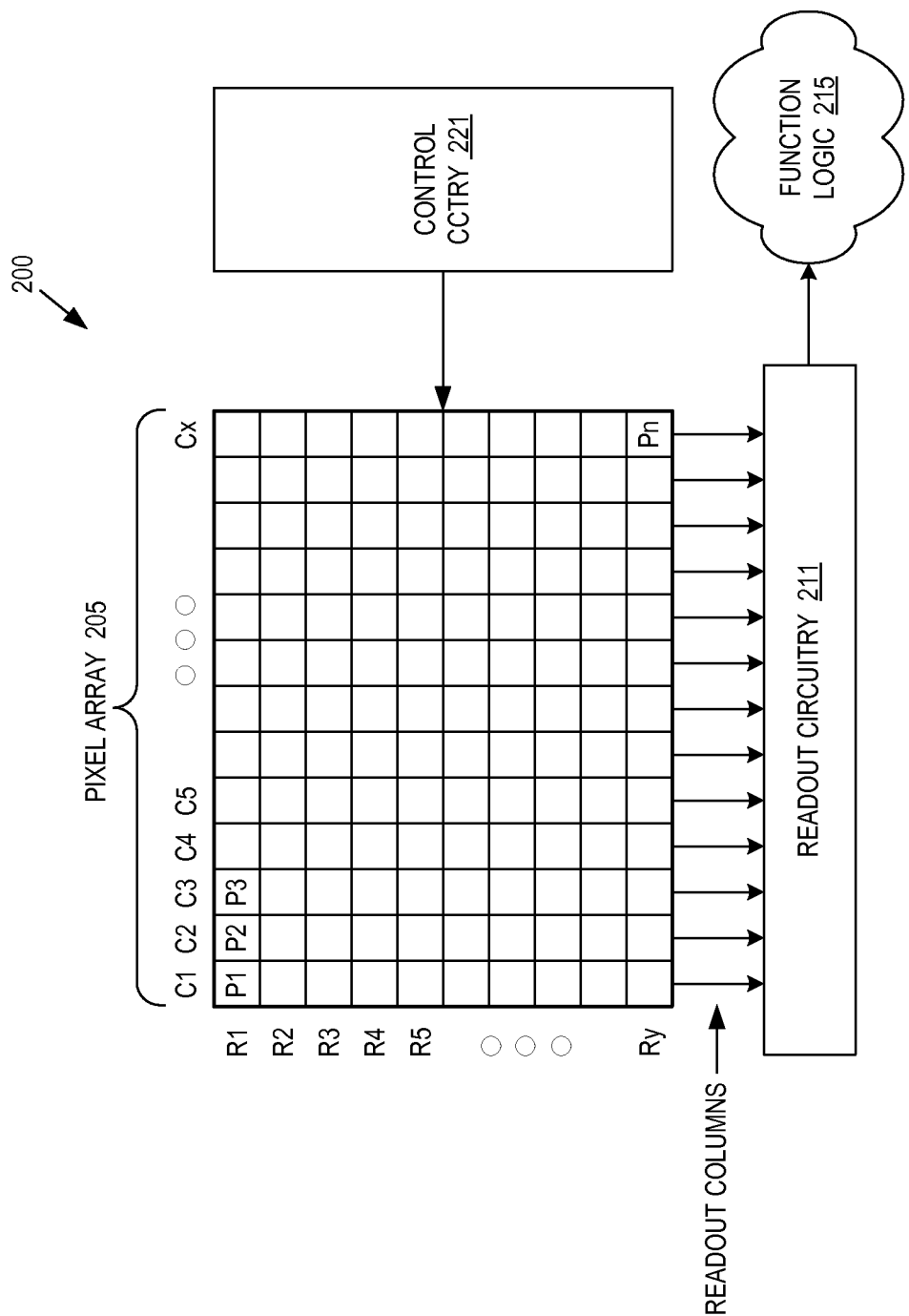
FIG. 2 is a block diagram illustrating one example of an imaging system, in accordance with the teachings of the present invention.

FIG. 2 is a block diagram illustrating one example of an imaging system including quantum dot image sensor 100. Imaging system 200 includes pixel array 205, control circuitry 221, readout circuitry 211, and function logic 215. In one example, pixel array 205 is a two-dimensional (2D) array of photodiodes, or image sensor pixels (e.g. pixels P1, P2 . . . , Pn). As illustrated, photodiodes are arranged into rows (e.g. rows R1 to Ry) and columns (e.g. column C1 to Cx) to acquire image data of a person, place, object, etc., which can then be used to render a 2D image of the person, place, object, etc.

In one example, after each image sensor photodiode/pixel in pixel array 205 has acquired its image data or image charge, the image data is readout by readout circuitry 211 and then transferred to function logic 215. Readout circuitry 211 may be coupled to readout image data from the plurality of photodiodes in pixel array 205. In various examples, readout circuitry 211 may include amplification circuitry, analog-to-digital conversion (ADC) circuitry, or otherwise. Function logic 215 may simply store the image data or even alter the image data by applying post image effects (e.g. crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously.

In one example, control circuitry 221 is coupled to pixel array 205 to control operational of the plurality of photodiodes in pixel array 205. Control circuitry 221 may be configured to control operation of the pixel array 205. For example, control circuitry 221 may generate a shutter signal for controlling image acquisition. In one example, the shutter signal is a global shutter signal for simultaneously enabling all pixels within pixel array 205 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 200 may be included in a digital camera, cell phone, laptop computer, or the like. Additionally, imaging system 200 may be coupled to other pieces of hardware such as a processor, memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

FIGS. 3A-3E show an example process 300 for forming a quantum dot image sensor (e.g. backside illuminated quantum dot image sensor 100). The order in which some or all of FIGS. 3A-3E appear in process 300 should not be deemed limiting. Rather, one of ordinary skill in the art having the benefit of the present disclosure will understand that some of the process may be executed in a variety of orders not illustrated, or even in parallel.

Figure 3A:
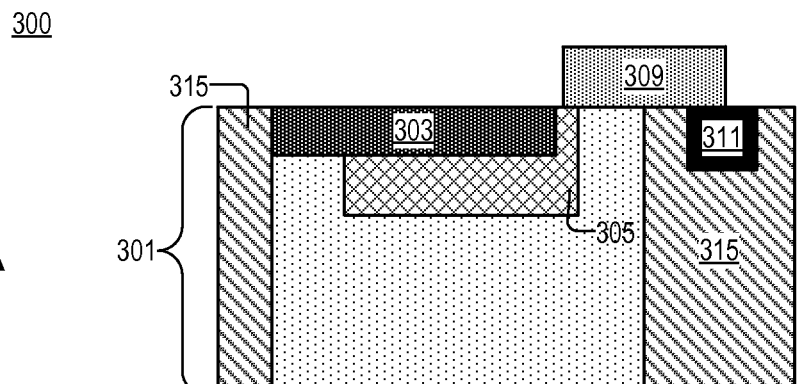
FIGS. 3A-3E show an example process for forming a quantum dot image sensor, in accordance with the teachings of the present invention.

FIG. 3A illustrates forming a p-n junction (e.g. first doped region 303 and second doped region 305) and ancillary circuitry in semiconductor material 301. In the depicted example, ancillary circuitry includes transfer gate 309, floating diffusion 311, and electrical isolation structures 315. It should be noted that in the depicted example, transfer gate 309 is disposed in part over second doped region 305, floating diffusion 311, and electrical isolation structure 315. This configuration provides for a sufficiently large potential barrier between the p-n junction and floating diffusion 311, and prevents image charge from leaking into floating diffusion 311 prior to application of a voltage to transfer gate 309. Although in the depicted example transfer gate 309 does not extend over first doped region 303, in other examples not depicted, transfer gate 309 may extend over first doped region 303.

Figure 3B:
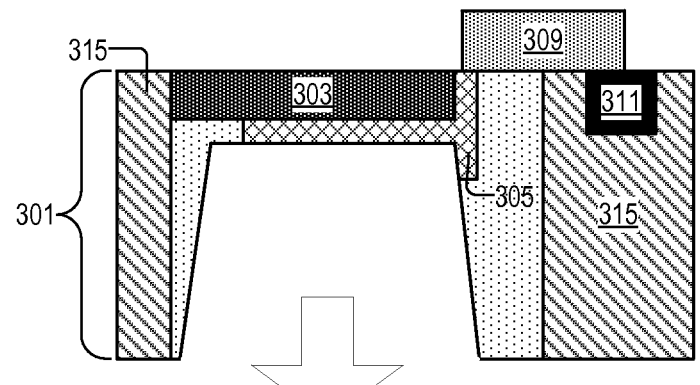

FIG. 3B illustrates etching a trench in semiconductor material 301. In the depicted example, the trench extends from the surface of semiconductor material 301 opposite the p-n junction to the p-n junction where it contacts second doped region 305. In one example, the trench may extend through semiconductor material 301 such that it makes contact with both second doped region 305 and first doped region 303. In one example, the trench may have sidewalls that are substantially vertical; however, in another example the trench may have side walls that are at an angle. The trench may be etched via a wet or dry etch process depending on desired trench geometry and other processing conditions and limitation.

Figure 3C:
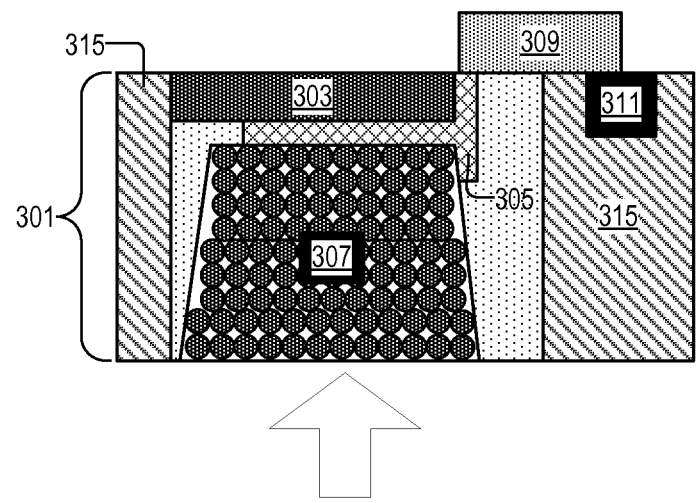

FIG. 3C illustrates depositing quantum dot layer 307 in the trench. In the depicted example quantum dot layer 307 entirely fills the trench and makes contact with the p-n junction—specifically second doped region 305. However, in another example, quantum dot layer 307 may make contact with both second doped region 305 and first doped region 303. In the depicted example, the lateral bounds of quantum dot layer 307 are coextensive with the lateral bounds of the p-n junction (e.g. first doped region 303 and second doped region 305). However, in a different example the lateral bounds of quantum dot layer 307 may be much larger than the lateral bounds of the p-n junction in order to further improve light absorption in the image sensor device. Further, second doped region 305 may partially extend under transfer gate 309, and quantum dot layer 307 may not be disposed (even in part) under transfer gate 309. In one example, semiconductor material 301 and electrical isolation structures 315 separate floating diffusion 311 from quantum dot layer 307, second doped region 305, and first doped region 303. However, in another example not depicted, the lateral bounds of quantum dot layer 307, second doped region 305, and first doped region 303 are coextensive with an internal area defined by electrical isolation structure 315 such that only electrical isolation structure 315 separates floating diffusion 311 from the p-n junction. In the depicted example, second doped region 305 is disposed between quantum dot layer 307 and first doped region 303; however, in an alternate example second doped region 305 may not be disposed between quantum dot layer 307 and first doped region 303. In some examples, both first doped region 303 and second doped region 305 may be disposed in any geometric arrangement such that the first doped region 303 and second doped region 305 are electrically coupled to quantum dot layer 307 and disposed to output charge to floating diffusion 311. In one example, first doped region 303 is p-type, second doped region 305 is n-type, and quantum dot layer 307 is n-type. However, in an alternate example, these majority charge carrier types may be reversed.

Quantum dot layer 307 may be deposited via a number of techniques depending on the type of quantum dots used. In one example, quantum dot layer 307 is deposited via a solution processing technique such as spin coating, blade coating, inkjet printing, or the like. After deposition of quantum dot layer 307, residual quantum dots may be removed from semiconductor material 301 via solution cleaning, chemical mechanical polishing, etc.

Figure 3D:
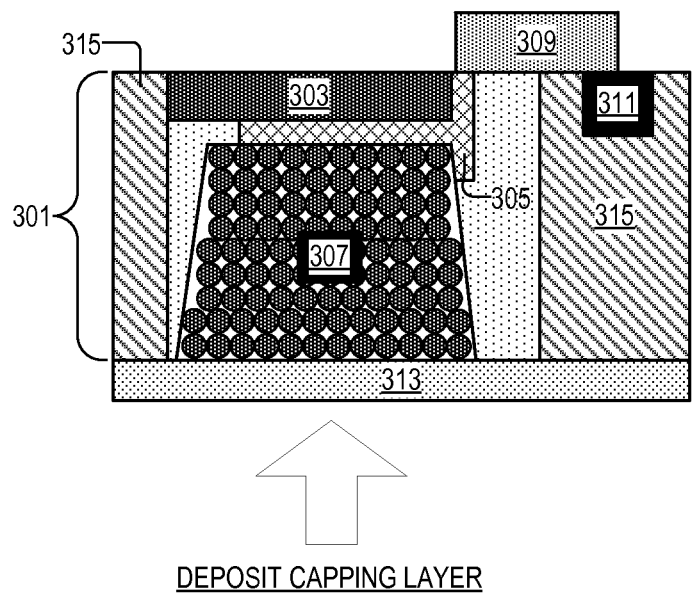

FIG. 3D illustrates depositing a capping layer 313 to encapsulate quantum dot layer 307. In the depicted example, capping layer 313 is made of an optically transparent and electrically inert material such as silicon oxide, silicon nitride, or the like. Capping layer 313 may be used to provide a homogeneous surface for the fabrication of other layers of device architecture and may also be used to prevent contaminants/charge traps from reaching quantum dot layer 307. It should be noted, that other layers/pieces of device architecture may be included in capping layer 313, as the depicted example is a mere illustration of one embodiment of the disclosure.

Figure 3E:
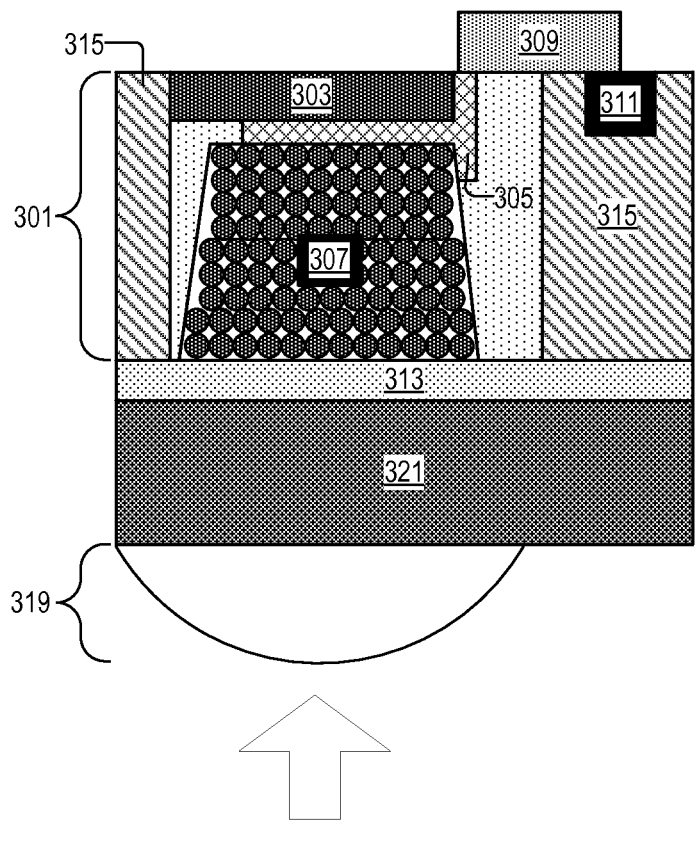

FIG. 3E illustrates forming the optical stack. In the depicted example, the optical stack includes color filter layer 321 and microlens layer 319. It is worth noting that in many examples, color filter layer is not needed. This is because quantum dot layer 307 will select for the proper wavelength of light by virtue of the size of the quantum dots used. However, in one example, quantum dot layer 307 may include a wide range of quantum dot sizes such that color filter layer 321 is necessary to distinguish between different wavelengths of light. In one example, color filter layer 321 includes red, green, and blue color filters which may be arranged into a Bayer pattern, EXR pattern, X-trans pattern, or the like. However, in a different or the same example, color filter layer 321 may include infrared filters, ultraviolet filters, or other light filters that isolate invisible portions of the EM spectrum. In one example, microlens layer 319 may be fabricated from a photo-active polymer that is patterned on the surface of color filter layer 321. Once rectangular blocks of photo-active polymer are patterned on the surface of color filter layer 121 or capping layer 313, the blocks may be melted (or reflowed) to form the dome-like structure characteristic of microlenses.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A photodetector, comprising:
a first doped region disposed in a semiconductor material;
a second doped region disposed in the semiconductor material, wherein the second doped region is electrically coupled to the first doped region, and wherein the second doped region is of an opposite majority charge carrier type as the first doped region;
a quantum dot layer disposed in a trench in the semiconductor material to generate image charge in response to incident light, wherein the quantum dot layer is electrically coupled to transfer the image charge to the second doped region; and
a transfer gate and a floating diffusion, wherein the floating diffusion is disposed in the semiconductor material and the transfer gate is positioned to transfer the image charge from the second doped region to the floating diffusion.

2. The photodetector of claim 1, wherein the second doped region is disposed between the first doped region and the quantum dot layer.

3. The photodetector of claim 2, wherein the second doped region and the first doped region form a pinned photodiode electrically coupled to, and including, the quantum dot layer.

4. The photodetector of claim 1, further comprising a capping layer, wherein the capping layer encapsulates the trench containing the quantum dot layer.

5. The photodetector of claim 1, wherein light is absorbed in the quantum dot layer through a backside of the photodetector.

6. The photodetector of claim 1, wherein light is absorbed in the quantum dot layer through a frontside of the photodetector.

7. The photodetector of claim 1, further comprising electrical isolation structures in the semiconductor material, wherein the electrical isolation structures surround the photodetector at least in part.

8. The photodetector of claim 1, wherein individual quantum dots in the quantum dot layer include a chemical composition to exhibit multiple exciton generation.

9. The photodetector of claim 8, wherein the quantum dot layer is electrically coupled to transfer more than one charge carrier to the second doped region for each photon of the light received by the quantum dot layer.

10. The photodetector of claim 1, wherein the quantum dot layer has a first conduction bad energy, and the second doped region has a second conduction band energy, wherein the first conduction band energy is greater than the second conduction band energy for the image charge to flow from the quantum dot layer to the second doped region.

11. The photodetector of claim 1, wherein the quantum dot layer is in contact with, and electrically coupled to, the first doped region and the second doped region.

12. An image sensor, comprising:
a plurality of photodiodes including:
a p-n junction disposed in a semiconductor material; and
a quantum dot layer disposed in a trench in the semiconductor material, wherein the quantum dot layer is electrically coupled to the p-n junction to transfer image charge to the p-n junction, and wherein the quantum dot layer is disposed to receive light and generate the image charge in response to the light;
electrical isolation structures disposed in the semiconductor material to reduce current flow between individual photodiodes in the plurality of photodiodes;
a transfer gate and a floating diffusion, wherein the transfer gate is electrically coupled to the p-n junction to transfer the image charge from the p-n junction to the floating diffusion.

13. The image sensor of claim 12, wherein individual quantum dots in the quantum dot layer include a metal chalcogenide.

14. The image sensor of claim 12, further comprising a capping layer, wherein the capping layer is disposed to cover the trench in the semiconductor material, and wherein the capping layer encapsulates the quantum dot layer.

15. The image sensor of claim 14, further comprising a microlens layer, wherein the capping layer is disposed between the quantum dot layer and the microlens layer, and wherein the microlens layer directs light into the quantum dot layer.

16. The image sensor of claim 12, wherein the electrical isolation structures include doped wells formed in the semiconductor material.

17. A method of image sensor operation, the method comprising:
accumulating image charge in a plurality of photodiodes, wherein individual photodiodes in the plurality of photodiodes are electrically isolated from one another, and wherein the plurality of photodiodes includes:
a p-n junction disposed in a semiconductor material; and
a quantum dot layer disposed in a trench in the semiconductor material to generate image charge in response to absorbing light, wherein the quantum dot layer is electrically coupled to the p-n junction;
extracting the image charge from the quantum dot layer using the p-n junction to separate hole-electron pairs formed in the quantum dot layer; and
transferring the image charge from the p-n junction in the individual photodiodes to a plurality of floating diffusions in response to a transfer signal applied to a gate terminal of a transfer gate, wherein the transfer gate is disposed between the plurality of photodiodes and the plurality of floating diffusions.

18. The method of claim 17, further comprising directing light into the plurality of photodiodes through a microlens layer, wherein the microlens layer is positioned to focus light on the plurality of photodiodes.

19. The method of claim 18, further comprising filtering light with a color filter layer disposed between the microlens layer and the plurality of photodiodes.

20. The method of claim 18, further comprising filtering light, wherein the quantum dot layer filters light based on the size of individual quantum dots in the quantum dot layer.

21. The method of claim 17, further comprising reading out the image charge from the image sensor via readout circuitry.

\* \* \* \* \*